United States Patent [19]
Freidin

[11] Patent Number: 5,414,377
[45] Date of Patent: May 9, 1995

[54] LOGIC BLOCK WITH LOOK-UP TABLE FOR CONFIGURATION AND MEMORY

[75] Inventor: Philip M. Freidin, Sunnyvale, Calif.

[73] Assignee: Xilinx, Inc., San Jose, Calif.

[21] Appl. No.: 324,858

[22] Filed: Oct. 18, 1994

Related U.S. Application Data

[63] Continuation of Ser. No. 994,002, Dec. 21, 1992.

[51] Int. Cl.6 .......................................... H03K 19/177
[52] U.S. Cl. ........................................ 326/41; 326/40
[58] Field of Search ................... 307/465, 443, 465.1; 365/201, 189.02, 189.05; 326/38–41, 47

[56] References Cited

U.S. PATENT DOCUMENTS

| | | | |
|---|---|---|---|
| 4,706,216 | 11/1987 | Carter | 365/94 |
| 4,870,302 | 9/1989 | Freeman | 307/465 |
| 5,245,226 | 9/1993 | Hood, Jr. et al. | 307/465 |
| 5,245,227 | 9/1993 | Furtek et al. | 307/465 |

OTHER PUBLICATIONS

Xilinx Programmable Gate Array Data Book, 1992, available from Xilinx, Inc. 2100 Logic Drive, San Jose Calif. 95124.

Primary Examiner—Edward P. Westin
Assistant Examiner—Jon Santamauro
Attorney, Agent, or Firm—Edel M. Young

[57] ABSTRACT

A logic block for a field programmable logic device which is of the type using memory bits in a look-up table to provide any function of several inputs, and which uses additional memory bits to control aspects of the configuration, achieves a smaller size by replacing memory bits which control some configuration choices of the logic block with multiplexers which alternately select a default configuration or allow the look-up table memory bits to control the configuration. Thus the memory bits perform an alternate function of serving as a look-up table to generate a function, and controlling gates such as multiplexers, XOR gates or AND gates to generate a function.

3 Claims, 3 Drawing Sheets

LOGIC BLOCK WITH LOOK-UP TABLE FOR CONFIGURATION AND MEMORY

This application is a continuation of application Ser. No. 07/994,002, filed Dec. 21, 1992.

FIELD OF THE INVENTION

The invention relates to field programmable integrated circuit devices, more particularly to field programmable gate arrays in which internal logic blocks are configured partly by loading a memory and partly by setting certain configuration bits.

BACKGROUND OF THE INVENTION

Field programmable gate arrays (FPGAs) are user programmable logic devices formed in integrated circuit chips, which include within them configurable logic blocks and a configurable interconnect structure. By configuring the chip, the logic blocks can each be made to perform a selected one of many functions, and the interconnect can be connected to route signals from one logic block and to points exterior to the chip. Thus the FPGA can be programmed or configured to perform a desired complex function and provide output signals at selected exterior pins as specified by the user. Some FPGAs are non-volatile and one-time programmable. Others are reprogrammable. Some have logic blocks configured by applying particular signals to logic gate inputs or multiplexer control inputs. Others are configured by applying a combination of signals to logic gate inputs or multiplexer controls and loading a sequence of bits into a memory. The memory provides a logic function of signals on memory address lines, the function being determined by the set of values loaded into the bits of the memory. Such devices are manufactured by Xilinx, Inc., assignee of the present invention, and are described more thoroughly in the 1992 "The Programmable Gate Array Data Book" available from Xilinx, Inc., 2100 Logic Drive, San Jose, Calif. 95124. Such devices are also described in U.S. Pat. Nos. 4,870,302, and 4,706,216 incorporated herein by reference. FIG. 8 of the '216 patent in particular, describes a logic block which is configured by loading bits in a memory and configuring certain multiplexers, exclusive-or gates and AND gates to respond in particular ways to other input signals.

FIG. 1 shows a logic block of the type discussed in U.S. Pat. No. 4,706,216. 8-bit RAM 108 provides a configurable function of the address bits A, B, and C on lines 110-1, 110-2, and 110-3 respectively. Multiplexers 112, 113, 114, 123, 126, 127, and 128 determine whether one of the 8 bits in RAM 108 will be forwarded. XOR gates 124, 129, and 130 determine whether the outputs of multiplexers 123, 127, and 128 respectively will be inverted, and AND gates 125, 131, and 132 determine whether the respective outputs of the XOR gates will be passed to a terminal of storage device 121. In order to select the desired option, a control signal must be provided to each of these multiplexers, XOR gates and AND gates. Thus, a means of storing the signal must be provided, such as a memory cell.

In FIG. 1, a second 8-bit RAM 109 can also be configured to provide another function of the inputs A, B and C. Input signal D causes multiplexer 112 to select between the two functions. Thus the logic block of FIG. 1 can provide a selectable function of the inputs A, B, C, and D. It frequently occurs that a user may partition logic into the chip so that only three inputs, for example A, B, and C are used in a particular logic block, and that the D input is not used (tied to a constant value rather than connected to receive a logic signal). In this case it is not necessary to use both 8-bit RAMs 108 and 109 since either RAM could provide all functions of three inputs. Thus some silicon area which has been dedicated to the second 8-bit RAM is not used.

SUMMARY OF THE INVENTION

The present invention is used in a logic array which comprises a plurality of logic blocks. Each logic block may in a first or default mode calculate a larger number of functions of a maximum number of variables. In a second or fully configurable mode the logic block may calculate a smaller number of functions of one less variable. Since the mode of each block is separately selected, the chip offers a good combination of gate density and function flexibility.

It is always preferable to implement logic in the smallest silicon area possible in order to save cost and increase speed. The present invention allows for some memory bits which in the prior art were used only to represent a function in a look-up table of a logic block to alternately control configuration of some elements such as multiplexers, XOR gates and AND gates. Certain of the multiplexers, XOR gates or AND gates (or other functions in other embodiments) are much more commonly used in one configuration than in another so that it is reasonable to provide a default configuration of these elements. According to the invention, a default configuration is provided in which multiple controllable elements are controlled from a single signal. When the elements are to be used in their default configuration, the memory bits which would control them can provide a logic function. When the elements are to be used in a user-selected configuration, an input signal is not used, and the logic function of that input is not provided.

Means for controlling whether the default condition is used and means for selecting between a default value and a user's value are provided in the logic block. The means for controlling whether the default condition is used can be one or a few memory cells, and the means for selecting between the default value and the user's value can be a two-input multiplexer (requires only two transistors). Depending upon the size of a memory cell (five transistors in an embodiment described in U.S. Pat. No. 4,750,155 for example), the size of a multiplexer (two transistors) and the area which must be dedicated to routing signals, the invention can save considerable chip area and thus reduce the cost of the chip.

DETAILED DESCRIPTION OF THE INVENTION

Figure 1:
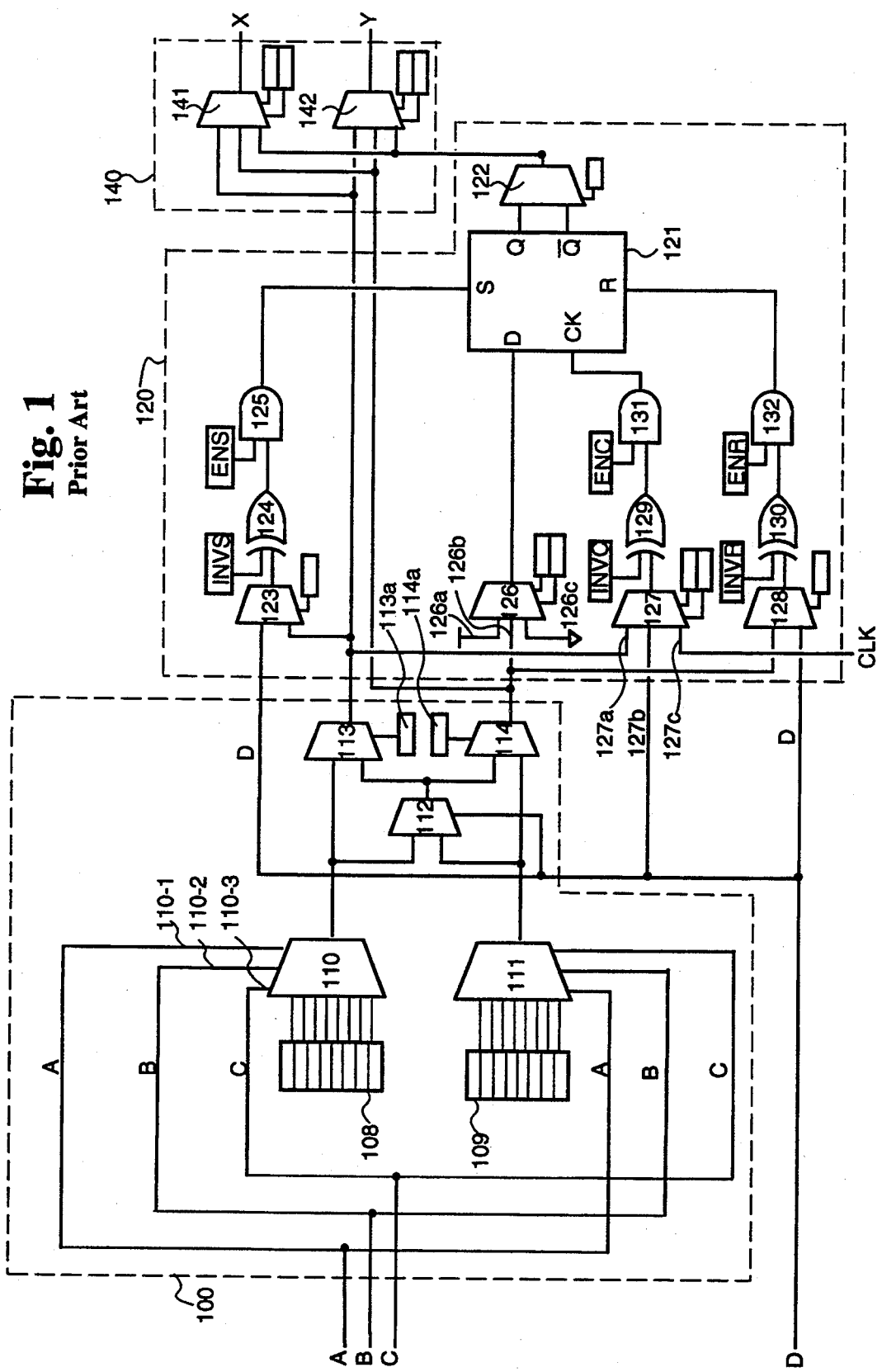
FIG. 1 shows a prior art logic block which uses memory cells to store a logic function look-up table.

As was shown in FIG. 1, memory cells 113a and 114a select the states of multiplexers 113 and 114 respectively. If the logic block of FIG. 1 is being used to compute a function of four variables, A, B, C, and D, memory cells 113a and 114a will cause multiplexers 113 and 114 to select the input from multiplexer 112. Multiplexer 112 is controlled by input signal D, which is treated as the fourth variable to select between the outputs of select generators 110 and 111. If the logic block of FIG. 1 is to generate a function of three variables, or two separate functions of three variables, memory cell 113 will cause multiplexers 113 and 114 to each directly select the output of select units 110 and 111, respectively. It is frequently the case that only one function of three input variables will be calculated in the logic block of FIG. 1 and that it will not be necessary to use both of the select generators 110 and 111. Other configurable parts of the logic block such as the signals for controlling the set and reset inputs of the storage device 121 may most frequently be configured to disable the set and reset functions. Likewise, most frequently, the output of multiplexer 114, rather than a constant high or low signal will be provided to the D input of storage device 121. Other parts of the logic block may be operated in a particular mode most of the time, for example the clock input CK may most often be driven using the CLK input.

Figure 2:
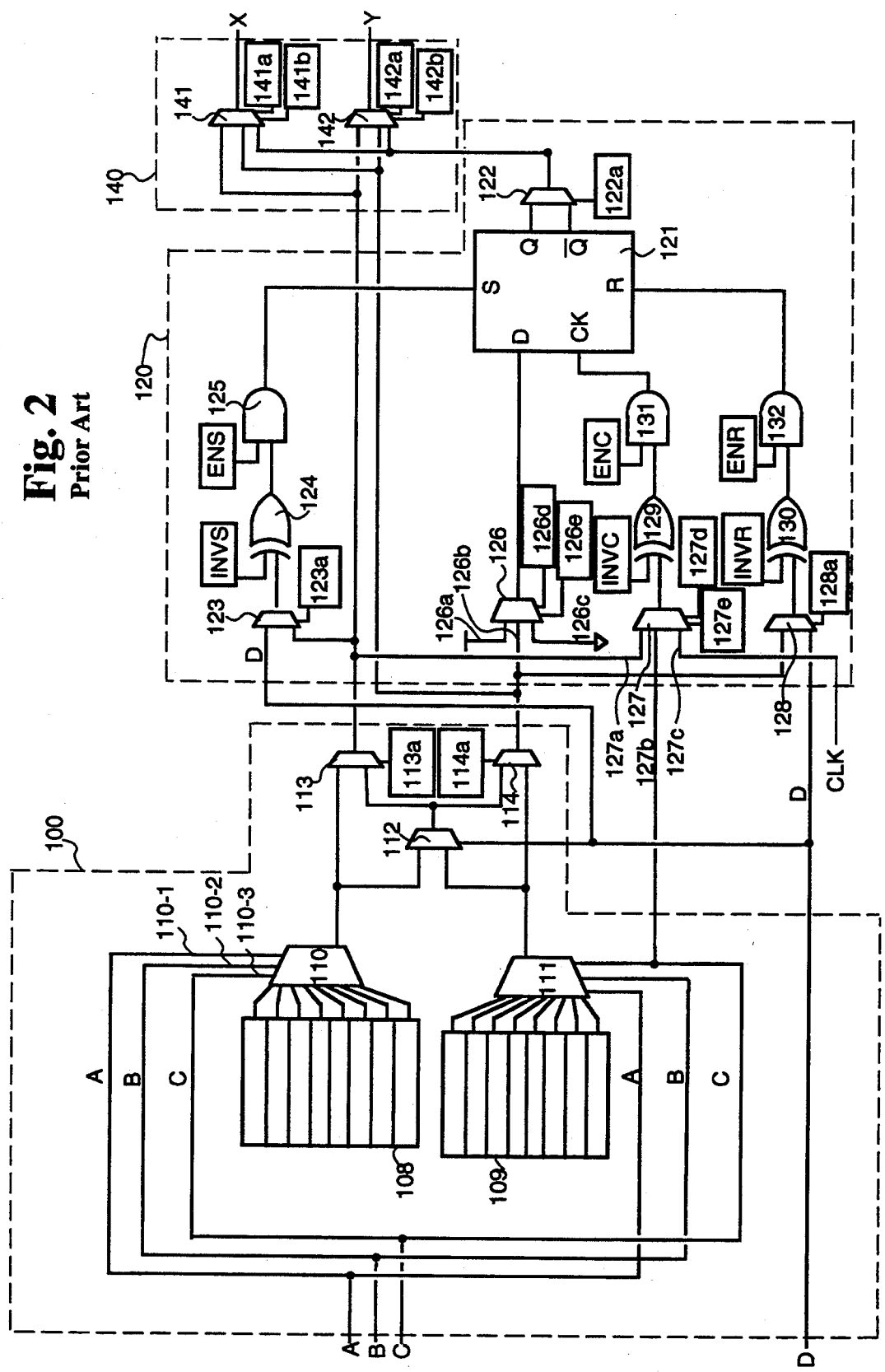
FIG. 2 is a re-drawing of FIG. 1 showing multiplexers and memory cells sized more in proportion to the actual area occupied in a typical integrated circuit device.

FIG. 2 is a redrawing of the logic block of FIG. 1 which differs in the relative sizes of the multiplexers and memory cells and shows these elements in a relationship more close to the physical area actually occupied on the chip. As can be seen in FIG. 2, the memory cells occupy a significant portion of the total area. In particular, a memory cell occupies a larger portion than a multiplexer. (Memory cells take on the order of five transistors, whereas multiplexers take as few as two transistors.) Thus it becomes clear from looking at the relative sizes in FIG. 2 that total chip area can be saved by reducing the number of memory cells.

According to the present invention, when less than the maximum number of variables are being used in one of the logic blocks, the memory for one of the select generators is given an alternative purpose of configuring other parts of the logic block to configurations other than their default configuration. Thus the number of memory cells needed to configure the chip is reduced. The present invention adds one or more memory cells for indicating a default state, but reduces the number of memory cells needed to control certain multiplexers or other controllable elements when those elements are to be operated in their default state. When the logic block is used in its default configuration, the memory cells which are not needed to configure the block are available to generate a function.

Figure 3:
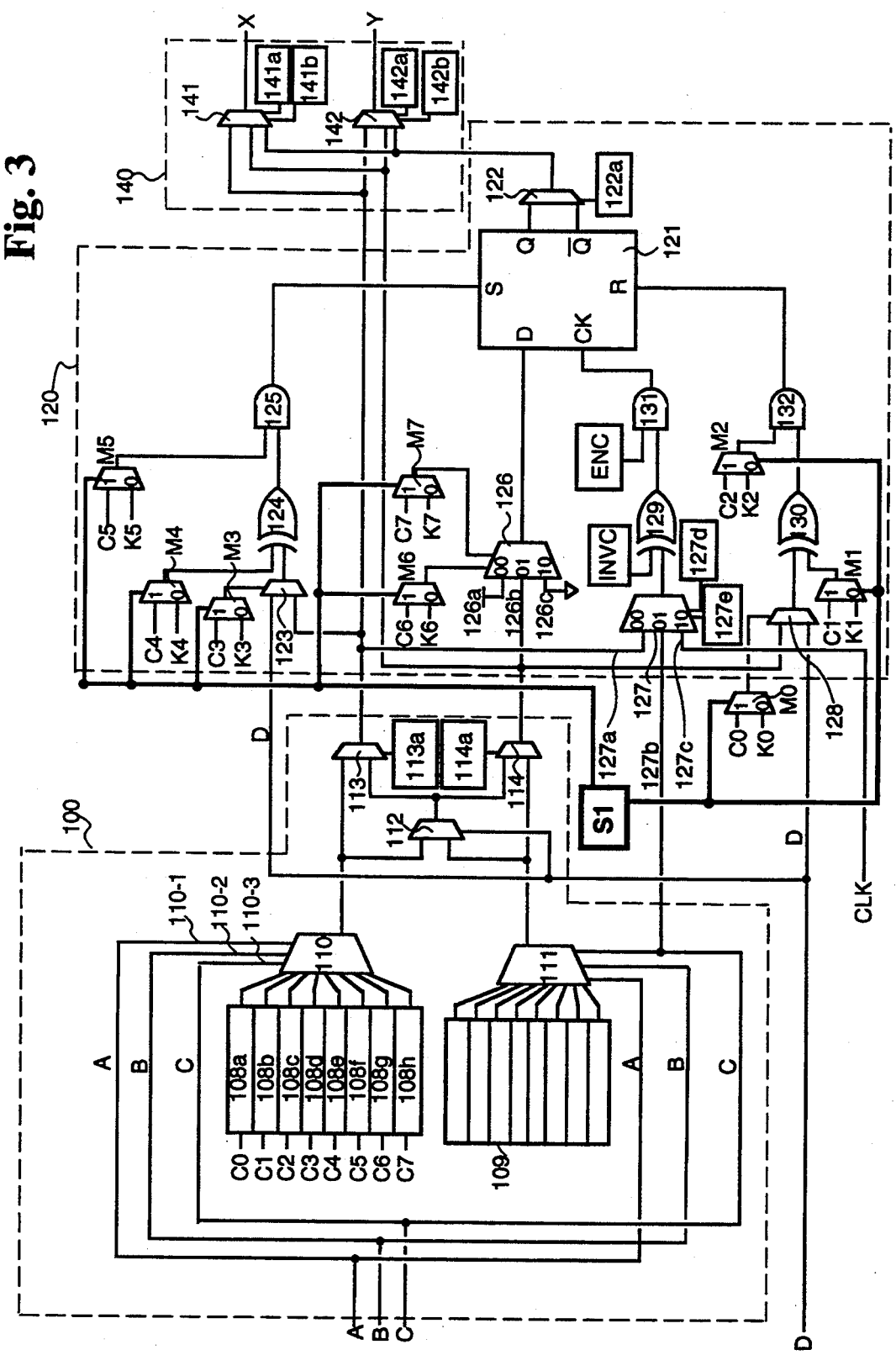
FIG. 3 shows a logic block of the present invention which uses some memory cells for the combined function of storing a logic function look-up table and controlling configuration of part of the logic block.

FIG. 3 shows a logic block according to the present invention in which additional memory cell S1 indicates whether the logic block is to be used in its default mode, providing a function of four variables, A, B, C, and D but configured in its default configuration, or whether it is to provide a function of three variables, for example A, B, and C, but configured in a user selected configuration. Memory cells 108a through 108h provide the dual function of generating a function of three of the four variables A, B, C, and D or of configuring certain of the multiplexers in the remainder of the logic block. For example, memory cell 108a stores a 0 or 1, which can be provided as a function to the inputs of multiplexers 112 and 113 in response to a particular address provided on lines 110-1, 110-2, and 110-3 which are driven by signals on input lines A, B, C. The value in memory cell 108a, which is output on line C0, also provides an input to multiplexer M0, for controlling multiplexer 128 when multiplexer M0 is not in its default mode. When multiplexer 128 is in its default mode, added memory cell S1 causes multiplexer M0 to provide a constant value K0, either high or low, to the control terminal of multiplexer 128, thus placing multiplexer 128 into its default mode. Thus the memory cell 128a which was provided in the prior art embodiment of FIG. 2 has been replaced by multiplexer M0, input line C0 and the connection K0 to high or low voltage. This replacement occupies considerably less area than the original cell, and therefore saves total chip area. Likewise, lines C1 through C7 from memory cells 108b through 108h also provide configuration control signals to multiplexers M1 through M7 respectively, which are operated in their default mode in response to a first value in memory cell S1 and are operated in a user selected mode when a second value is stored in memory cell S1. The embodiment shown in FIG. 3 eliminates the set and reset controls and the D input disable in the default mode, and is only one of many embodiments of the present invention. The default connection to high or low voltage (represented by K0 through K7 in FIG. 3) is not a configuration choice of the user. It is a permanent connection made when the chip is manufactured.

Other multiplexers and controllable elements can be provided in a logic cell and alternatively controlled through a select multiplexer to operate in a default mode or in a user-selected mode. The particular multiplexers or other controllable elements which are alternatively operated in a default or a user selected mode should be those which can tolerate the reduced flexibility of user control most easily.

Other embodiments of the present invention will become obvious to those skilled in the art in light of the above description and are intended to be included in the scope of the present invention.

I claim:

1. A logic block for a configurable logic array integrated circuit comprising:
   a first memory unit (111) having a first plurality of memory bits (109) for generating a first function in response to a first plurality of inputs (A, B, C);
   a second memory unit (110) having a second plurality of memory bits (108a–108h) for generating a second function in response to a second plurality of inputs (A, B, C);
   at least one multiplexer (M0–M7) which supplies a control signal to a controllable element (i.e. 124, 126) to cause said controllable element to alternatively have a default configuration (set by K0–K7) and a selected configuration (set by C0–C7) configurable by a corresponding at least one memory bit (108a–108h) from said second plurality of memory bits; and
   means (S1) for selecting between said default configuration and said selected configuration.

2. A logic block for a configurable logic array integrated circuit comprising:
   a first memory unit (111) having a first plurality of memory bits (109) for generating a first function in response to a first plurality of inputs (A, B, C);

a second memory unit (110) having a second plurality of memory bits (108a–108h) for generating a second function in response to a second plurality of inputs (A, B, C);

at least one element (M0–M7) which can alternatively have a default configuration established by connecting an input to high or low voltage (set by K0–K7) and a selected configuration (set by C0–C7) configurable by a corresponding at least one memory bit (108a–108h) from said second plurality of memory bits; and means (S1) for selecting between said default configuration and said selected configuration;

in which:
said at least one element which can alternatively have a default configuration is a plurality of elements less than or equal in number to the number of said second plurality of bits; and
said at least one of said bits in said second plurality of memory bits is all of said second plurality of memory bits.

3. A logic block as in claim 2 in which:
said at least one element which can alternatively have a default configuration is a plurality of elements equal in number to the number of said second plurality of bits.

* * * * *